United States Patent [19]

Haining et al.

[11] 3,960,561
[45] June 1, 1976

[54] METHOD FOR MAKING ELECTRICAL LEAD FRAME DEVICES

[75] Inventors: Frank W. Haining, Binghamton; Joseph M. Kolly; Thomas E. Lynch, Jr., both of Vestal, all of N.Y.

[73] Assignee: International Business Machines Corporation, Armonk, N.Y.

[22] Filed: Apr. 10, 1975

[21] Appl. No.: 566,856

[52] U.S. Cl. .................................. 96/36.2; 29/625; 156/3; 156/11; 156/18; 156/247; 428/96
[51] Int. Cl.² ........................................... H05K 1/00
[58] Field of Search ............ 156/3, 13, 18, 11, 247; 428/96, 98; 96/36.2; 29/624, 625

[56] References Cited
UNITED STATES PATENTS

| | | | |
|---|---|---|---|
| 3,663,376 | 5/1972 | Uchgtil et al. ....................... | 96/36.2 |
| 3,750,277 | 8/1973 | Happ ..................................... | 29/624 |
| 3,773,628 | 11/1973 | Misawa et al. ........................ | 156/18 |
| 3,778,899 | 12/1973 | Johnson ................................ | 29/624 |
| 3,808,679 | 5/1974 | Dalmasso .............................. | 156/3 |
| 3,888,745 | 6/1975 | Hojgo ................................... | 156/247 |

*Primary Examiner*—William A. Powell
*Assistant Examiner*—Jerome W. Massie
*Attorney, Agent, or Firm*—C. A. Krenzer

[57] ABSTRACT

A method for making lead frame devices wherein a thin metal foil is adhered to a stiffener panel by means of a photoresist layer to enable all processing steps by which the metal foil is transformed into an appropriate and predetermined lead frame configuration. After the lead frame fabrication is completed, the photoresist is removed by suitable means and ready for application and functional use as an electronic component electrical connecting device.

7 Claims, 1 Drawing Figure

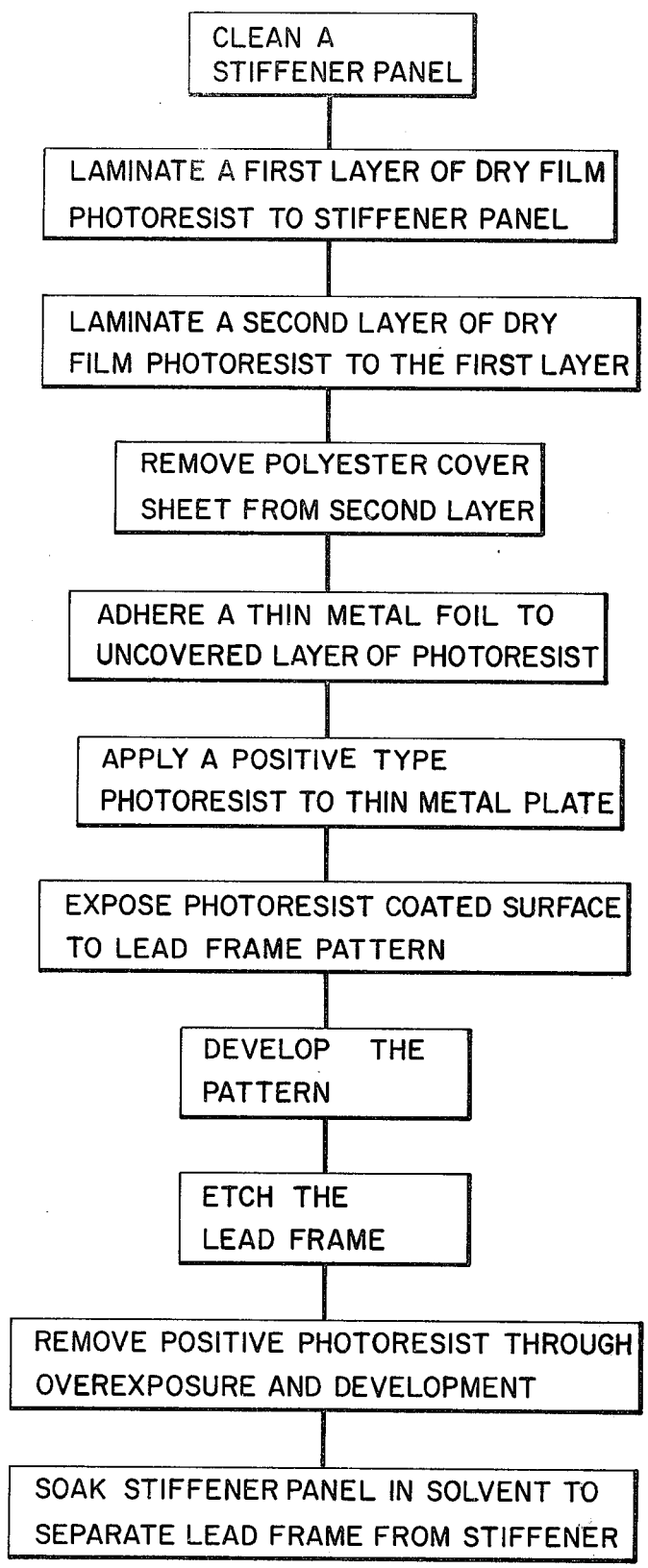

METHOD FOR MAKING ELECTRICAL LEAD FRAME DEVICES

BACKGROUND OF THE INVENTION

1. Field of the Invention

This invention relates to methods of making thin metal foil lead frames of the type which are used as electrical connecting devices.

2. Description of the Prior Art

The development of large scale integration (LSI) circuit devices or wafer devices mounted on a base provide an important advance in the electronic art because of the ability to provide varied and complicated circuits containing a plurality of elements in relatively small units. Problems exist of packaging these devices, particularly with respect to providing conductive paths to the numerous terminal points and to support them properly. One approach to this problem is to provide a device known as a lead frame, which is a member supporting a plurality of conductive leads in a prearranged pattern to which the integrated circuit device could be connected.

While the fabrication of lead frames for integrated circuit devices appears relatively simple in principle, the processing operations present many practical difficulties in regard to the selection of proper materials and the fabrications thereof into suitable form. Further, due to the limited space requirements, the circuitry is usually very dense. This imposes serious constraints on width and thickness of the conductive elements of the lead frame which are designed to make contact with contact areas on the LSI devices.

In the prior art, U.S. Pat. No. 3,778,899 teaches a process of fabricating a circuit pattern on a base member by electrodeposition and subsequently transferring the circuit pattern to a flexible dielectric substrate. U.S. Pat. No. 3,602,635 teaches the use of a photoresist layer in a microcircuit device to shield the sharp edges of metal bodies thereunder. Also, U.S. Pat. No. 3,537,175 relates a layer of relatively soft conductive material deposited longitudinally on a narrow strip of flexible metal material. The strip is stamped to form a plurality of integrally connected lead frames with narrow lead portions adapted for bonding to substrate supporting tips. No patents are known wherein a thin metal foil is adhered to a stiffener panel through the medium of a photoresist layer to enable processing steps by which the metal foil is transformed into an appropriate lead frame configuration.

SUMMARY OF THE INVENTION

It is a principal object of the invention to provide for making lead frame devices utilizing thin metal foils.

Another object of our invention is to provide a lead frame comprised of a thin metal foil material in the form of a supporting frame and having integral, narrow lead portions arranged in a predetermined pattern.

In accordance with the invention, there is provided methods for making lead frame devices wherein a thin metal foil, typically 1 oz. copper, or the like, is adhered to a stiffener panel through the medium and utilization of a photoresist layer of material to enable all processing steps by which the metal foil is transformed into an appropriate and predetermined lead frame configuration. After the lead frame fabrication has been completed, the photoresist is removed by suitable methods and the lead frame is ready for application and functional use as an electronic component electrical connecting device.

The foregoing and other objects, features and advantages of the invention will be apparent from the following more particular description of preferred embodiments of the invention, as illustrated in the accompanying drawing.

BRIEF DESCRIPTION OF THE DRAWING

FIG. 1 is a flow diagram illustrating the steps of a method of the invention.

DESCRIPTION OF PREFERRED METHODS

When parts such as lead frames must be fabricated from thin metal foils, typically in the order of 1 oz. roll of copper, by a series of operations such as plating, etching, coating, and the like. There are numerous problems in handling the flexible foils. This invention eliminates those problems by temporarily adhering the foil to one or both sides of a stiffener panel during all chemical processing operations and then removing the parts from the panel for subsequent functional use. The drawing serves to illustrate the principal steps of the method of the invention. For example, a stiffener panel in the order of 20 mils thick is cleaned and then laminated on one or both sides with a layer of dry film photoresist by means of a resist roll laminator. Without removing the polyester cover sheet from the first layer of dry film photoresist, a second layer of dry film photoresist is laminated on both sides of the stiffener panel. The polyester cover sheet is removed from the second layer of dry film photoresist and a layer of preferably 1 oz. roll copper foil is adhered to the tacky resist by passing the foil in contact with the resist and through the roll laminator. A sheet of copper foil may then be adhered to the other side of the stiffener panel in the same manner, that is, utilizing the two layers of dry film photoresist. While copper is used in the preferable embodiment, aluminum or other metal foils may be used. Further, the foils may be gold plated to facilitate lead attachment in subsequent use. The stiffener panel with foil copper now adhered on both surfaces is in readiness to be processed for fabrication of lead frame parts. A word of caution regarding the handling of the stiffener panel, as now prepared, is that it cannot be soaked for a prolonged period of time in a stripping solution that will dissolve or swell the dry film photoresist. Short periods of soaking in methylene chloride-methanol or other soaking strippers can be tolerated since the dry film photoresist is protected except at the edges by means of the copper foil.

Lead frames can now be fabricated in the 1 oz. metal foil adhered to both sides of the stiffener panel by the following sequence of operations: a layer of a positive type photoresist is applied to the thin metal foil, and exposed under the desired lead frame etch pattern. The panel is then developed. The lead frames are etched and the photoresist removed by overexposing both sides without a pattern and again developing the stiffener panel. A negative type photoresist was then applied to both surfaces and exposed under a solder plating pattern and again developed. Land areas on the ends of the lead frame leads are plated with solder, other alloy metal, or even gold in accordance with a plating pattern so as to develop lands at the lead frame ends to facilitate electrical connection in subsequent assembly operations. The stiffener panel assembly was then soaked in a suitable solvent, as for example, methylene chloride-methanol in order to remove the lead frame copper conductive elements from the stiffener panel.

It is within the contemplation of this invention that any thin metal foil can be processed by adhering it to the stiffener panel. It is not intended that the invention be restricted to 1 oz. roll copper.

The salient features of this invention is the adhering of the thin flexible foils to a stiffener panel with an adhesive to eliminate the handling problems. Another feature is the use of dry film photoresist as a temporary adhesive medium. Multiple small, thin, delicate parts can be fabricated by processing one large stiff panel in accordance with conventional printed circuit techniques.

While the invention has been particularly shown and described with reference to preferred embodiments thereof, it will be understood by those skilled in the art that various changes in form and details may be made therein without departing from the spirit and scope of the invention.

We claim:

1. A method for making thin lead frame devices comprising the steps of:
    a. cleaning a stiffener panel,
    b. laminating a first layer of dry film photoresist having a polyester cover sheet thereon to one side of the stiffener panel,
    c. laminating a second layer of dry film photoresist having a polyester cover sheet thereon on said first layer of dry film photoresist,
    d. removing the polyester cover sheet from the second layer of dry film photoresist,
    e. adhering a thin metal foil to the uncovered second layer of dry film photoresist,
    f. applying a positive type photoresist to the thin metal foil,
    g. exposing the photoresist coated surface to a lead frame etch pattern,
    h. developing the exposed pattern,
    i. etching the lead frame to remove the positive photoresist by overexposing the surface minus a pattern and developing same, and
    j. soaking the stiffener panel assembly in solvent to remove the lead frame from the stiffener panel.

2. A method for making thin lead frame devices as defined in claim 1 wherein the thin metal foil adhered to the second layer of dry film photoresist is copper.

3. A method for making thin lead frame devices as defined in claim 1 wherein the thin metal foil adhered to the second layer of dry film photoresist is aluminum.

4. A method for making thin lead frame devices as defined in claim 1 wherein the thin metal foil adhered to the second layer of dry film photoresist is gold plated metal.

5. A method for making thin lead frame devices with land areas thereon comprising the steps of:
    a. cleaning a stiffener panel,
    b. laminating a first layer of dry film photoresist having a polyester cover sheet thereon to one side of the stiffener panel,
    c. laminating a second layer of dry film photoresist having a polyester cover sheet thereon on said first layer of dry film photoresist,
    d. removing the polyester cover sheet from the second layer of dry film photoresist,
    e. adhering a thin metal foil to the uncovered second layer of dry film photoresist,
    f. applying a positive type photoresist to the thin metal foil,
    g. exposing the photoresist coated surface to a lead frame etch pattern,
    h. developing the exposed pattern,
    i. etching the lead frame to remove the positive photoresist by overexposing the surface minus a pattern and developing same,
    j. applying a negative photoresist to the surface,
    k. exposing to a land area plating pattern,
    l. developing the land area plating pattern,
    m. plating up metallic composition according to the plating pattern to develop lands at the lead frame ends, and
    n. soaking the stiffener panel assembly in solvent to remove the lead frame from the stiffener panel.

6. A method for making thin lead frame devices with land areas thereon as defined in claim 5 wherein said metallic composition for plating up is solder.

7. A method for making thin lead frame devices with land areas thereon as defined in claim 5 wherein said metallic composition for plating up is gold alloy.

* * * * *